(12) United States Patent
Tanaka et al.

(10) Patent No.: US 6,356,572 B1
(45) Date of Patent: Mar. 12, 2002

(54) SEMICONDUCTOR LIGHT EMITTING DEVICE

(75) Inventors: Toshiaki Tanaka, Kodaira; Kenji Hiruma, Koganei; Hiroshi Hamada, Hachioji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/268,658

(22) Filed: Mar. 16, 1999

(30) Foreign Application Priority Data

Mar. 19, 1998 (JP) .......................................... 10-069726

(51) Int. Cl.$^7$ ................................................ H01S 5/34
(52) U.S. Cl. ............................. 372/45; 257/15; 372/46
(58) Field of Search ....................... 372/45, 46; 257/14, 257/15

(56) References Cited

U.S. PATENT DOCUMENTS 5,757,835 A * 5/1998 Ono et al. ..................... 372/46

FOREIGN PATENT DOCUMENTS

| JP | 5-7051 | 1/1993 |
| JP | 6-244509 | 9/1994 |
| JP | 6-334265 | 12/1994 |

OTHER PUBLICATIONS

IEEE Journal of Quantum Electronics, vol. 29, No. 6, Jun. 1993, 150 mW Fundamental–Transverse–Mode Operation of 670 nm Window Laser Diode, S. Arimoto et al, pp. 1874–1879.

IEEE Photonics Technology Letters, vol. 9, No. 4, Apr. 1997, "Highly Reliable 60 C 50–mW Operation of 650–nm Band Window–Mirror Laser Diodes", A. Shima et al, pp. 413–415.

* cited by examiner

Primary Examiner—James W. Davie
(74) Attorney, Agent, or Firm—Mattingly, Stanger & Malur, P.C.

(57) ABSTRACT

It is an object of the present invention to provide a semiconductor light emitting device capable of securing, in use of an optical information processing or an optical communication system, a low threshold and high efficiency operation as well as a high output characteristic.

An active layer structure having a flatness and an interface acuteness of a quantum well structure improved by introducing a multi-period super lattice structure between a substrate for crystal growth and a light emitting layer area further to on a misoriented substrate sued to enhance a homogeneity of a semiconductor crystal. Further, a carrier confinement and a light confinement can be enhanced by providing a margin for design of the quantum well structure. According to the present invention, it is possible to realize a semiconductor laser element which can improve, as compared with a semiconductor laser device to which the present process is not applied, a threshold current and a slope efficiency, and which can achieve, as compared with an element not provided with a window structure, a high output characteristic with a maximum optical output enhanced.

23 Claims, 9 Drawing Sheets

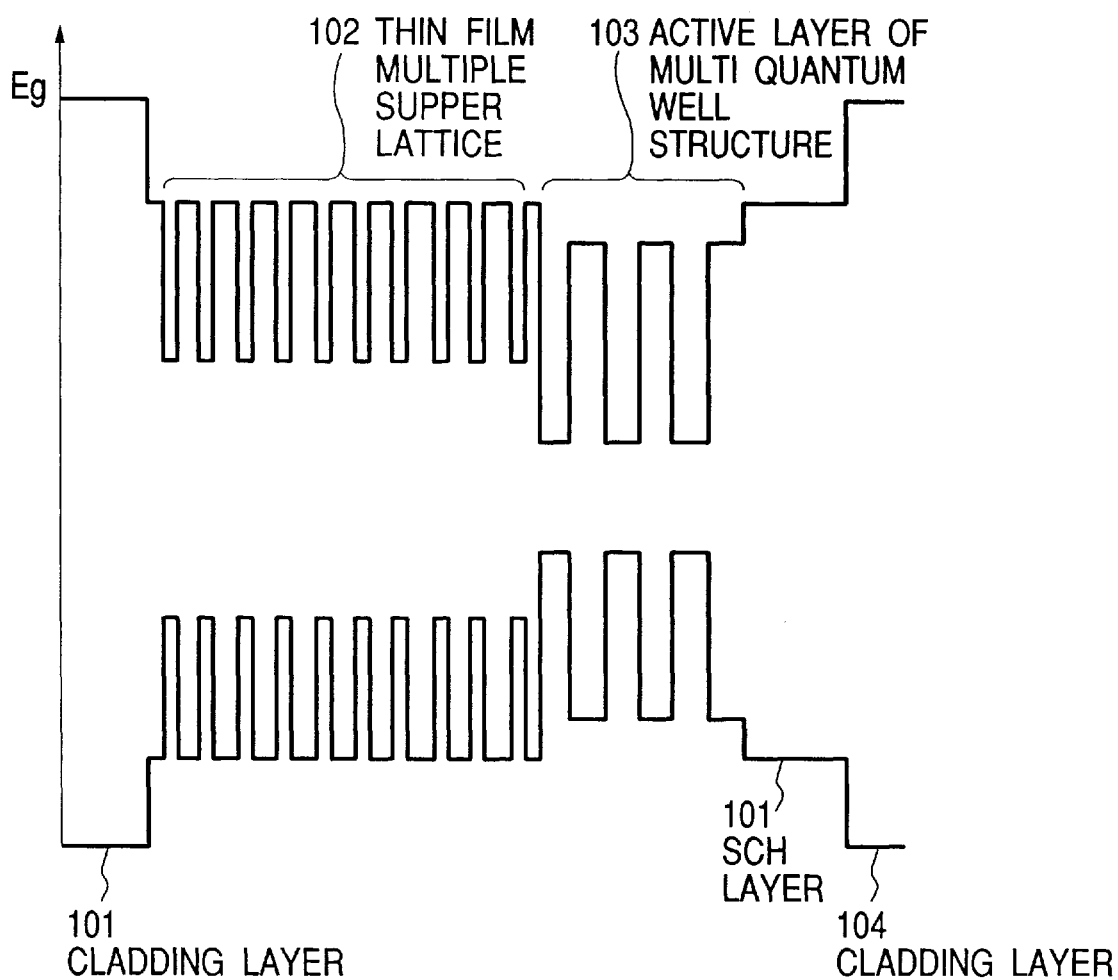

SEMICONDUCTOR LIGHT EMITTING DEVICE

FIELD OF THE INVENTION

The present invention relates to a semiconductor light emitting device. More particularly, the present invention is useful for a semiconductor laser device. Further, the semiconductor light emitting device according to the present invention is useful for use with optical information processing and optical communication light source.

BACKGROUND OF THE INVENTION

A high output semiconductor laser and a process for forming an element structure thereof for the purpose of a system application of a rewritable optical disk can be seen, for example, in IEEE J. Quantum Electron. 1993, vol. 29, No. 6, pp. 1874–1879, and IEEE Photonics Technol. Lett. 1997, vol. 9, No. 4, pp. 413–415.

On the other hand, it is requested that an injection current (or, an injection amount of a carrier of an electron, a positive hole or the like) to an active layer necessary for oscillation of a laser beam having a fixed intensity be reduced to increase an optical output of a semiconductor laser device. The reduction in a threshold current of the semiconductor laser device is one of techniques to fulfill the aforementioned request.

Further, as a technique for solving a problem of a leakage of a carrier injected into an active layer without contributing to laser oscillation, of a so-called carrier overflow, there is disclosed, in Japanese Patent Laid-Open No. Hei 5-7051, a technique in which a barrier region having a strained super lattice is provided between the active layer and a cladding layer. Further, a technique using a multi quantum barrier (MQB) structure similar to a multi-quantum well structure is disclosed in Japanese Patent Laid-Open No. Hei 6-244509. In these techniques, due to the barrier region or the multi-quantum barrier structure, a carrier which is about to leak from the active layer is returned to the active layer by the barrier region or the multi-quantum barrier structure. The operation of an operating mechanism thereof is performed by a potential barrier formed by the barrier region or the multi-quantum barrier structure. Furthermore, there is disclosed, in Japanese Patent Laid-Open No. Hei 6-334265, the constitution in which the multi-quantum barrier structure is employed as an optical guide layer of a multi-quantum well type active layer in order to adapt the aforementioned techniques to an active layer having the multi-quantum well structure.

SUMMARY OF THE INVENTION

While in the conventional techniques disclosed in above-described references and the like, the process for forming a window structure necessary for attaining a high output in terms of characteristics of elements is mentioned but the process simultaneously concurrently holding a low threshold operation other than the change of the active layer structure is not referred to.

Further, the above-described three Japanese Patent Laid-Opens disclose the technique in which the carrier overflow from the active layer is suppressed in the barrier region of the multi-quantum structure or the super lattice structure to realize the low threshold operation of the semiconductor laser, but do not teach whether or not the aforementioned techniques can be applied to the preparation of an element structure on the substrate having an angle of inclination from a main surface of a crystal. Such a substrate having on its surface the surface inclined from the main crystalline surface as a reference will be hereinafter referred to as "misoriented substrate". As the main crystalline surface, the miller index surface, for example, (100) surface can be mentioned.

In use of the misoriented substrate, for example, a semiconductor laser of a AlGaInP group has to be introduced in order that the oscillation wavelength is made into 650 nm or less. In the case where a crystal is grown on the misoriented substrate, the grown surface sometimes exhibits the shape which is different from that of the crystal grown on the normal substrate (the surface of the surface orientation (100) in the zinc blend crystalline structure). As an angle of inclination $\theta$ is set larger, a trouble of the photoconductive wave caused by the aforesaid shape, a deformation of a near field image and the like also appear. The problem resulting from the misoriented substrate is desired to be solved in terms of the applied field of the zinc blend type crystal.

A first object of the present invention is to secure a low threshold even if a misoriented substrate is used for a crystal growing substrate to constitute a semiconductor light emitting device.

A second object of the present invention is to provide a new construction capable of concurrently holding a low threshold and a high efficiency operation even if a misoriented substrate is used for a crystal growing substrate to constitute a semiconductor light emitting device. The low threshold and the high efficiency operation are useful matters in designing the structure of an active layer for obtaining a high output characteristic in a laser light source for optical information processing and optical communication system.

The present invention is useful particularly for a semiconductor laser device formed on the misoriented substrate, but attains the low threshold high efficiency operation simultaneously with the high output characteristic of the semiconductor laser device, and further realizes a system device using it as a light source. A semiconductor laser element using the misoriented substrate is widely used for a short-wavelength laser device.

The semiconductor light emitting device according to the present invention has the construction in which as a semiconductor substrate, a substrate away from the (100) surface orientation in the range of an inclination angle $\theta=0°<\theta\leq54.7°$ is used, and a semiconductor super lattice period thin film layer is inserted between the misoriented substrate and the active layer region. Further, by making the device described in the following, the quality of a semiconductor crystalline layer provided on the misoriented substrate can be further enhanced, and the element characteristic can be further improved. The present invention can hold simultaneously concurrently the low threshold high efficiency operation of the semiconductor laser element and the high output characteristic by the provision of the means described in detail in the following.

In the substrate away from the (100) surface orientation at the inclination angle $\theta$ of 54.7°, the crystalline surface thereof has the maximum inclination angle that can be actually used in the (111) surface. The inclination of the substrate in excess of the above is not practical.

The details of the semiconductor super lattice period thin film layer according to the present invention will be described later.

Prior to entry into the detailed description of the mode for carrying out the present invention, the main operation and effect of the super lattice periodic thin film layer provided in the semiconductor multi-layer particularly according to the present invention will be explained from three aspects.

A first effect is to enable enhancement of flatness of a multi-quantum well construction active layer. By the present invention, it is possible to keep a low threshold of a semiconductor light emitting device having threshold, for example, a semiconductor laser device. A second effect is to enable realization of a low threshold and high efficiency operation of a semiconductor laser device. A third effect is that the super lattice period thin film layer enables performance of a role as a stop layer of diffusion of impurity diffusion in a semiconductor laser device or the like.

A first aspect is a general aspect for a semiconductor device using a misoriented substrate and a semiconductor light emitting device.

A second aspect is useful particularly for a semiconductor laser device.

A third aspect is useful for a semiconductor light emitting device having a window structure in an optical output portion or a semiconductor laser device and is extremely practical.

First, introduction of a super lattice period thin film layer into the semiconductor multi-layer enhances a flatness and an interface acuteness of a multi-quantum well structure active layer.

Generally, when a misoriented substrate of a semiconductor is used, homogeneity of a crystalline layer provided thereon is enhanced. However, there is a problem in that particularly, in a thin film layer of the quantum well structure, the shake of a film thickness occurs in an order of an atomic layer.

This phenomenon is caused by a difference of a crystal growth speed in a periodic step of a terrace of the (100) surface in the crystalline surface and the atomic layer order. This generates a non-periodic difference in level. This difference in level is normally called a step bunching in this field.

FIG. 1 explains this phenomenon. FIG. 1 shows in its lower portion a schematic view of a section of a laminate of crystal, and schematically shows in its upper portion a valence electron band of a band structure corresponding to the above state. A well structure indicated by the arrow above the lower section shows a valence electron band at a fixed portion.

That is, in a surface 112 of a misoriented substrate 111, a reference surface (100) surface (indicated by a dotted line 117 in FIG. 1) is disposed stepwise (or terraced fields) in a direction of 116. A macroscopic inclination angle θ of the substrate is determined on the basis of the width of a terrace 113 of the (100) surface and a difference in level (a head) 114 between the terraces. A bend line 118 (a dotted line) shown in FIG. 1 shows an omitted portion of a multi-layer. A microscopic unevenness of the substrate surface is succeeded by the growth surface of a semiconductor layer grown thereon to form a difference in level 115 called the step bunching. As can be seen from the schematic view of the valence electron band of FIG. 1, an order 121 which is relatively high in quantum level is positioned in a region corresponding to the terrace 113, whereas an order 120 which is relatively low in quantum level is positioned in a region corresponding to the terrace 114. In the case where the laser oscillation is effected in that state, there occurs the situation in which a laser beam is absorbed by the difference in level 114 between the terraces positioned in the order 120 which is relatively low in quantum level. This leads to a rise of threshold or a fall of light emitting intensity in the semiconductor laser device.

The step bunching appearing on the semiconductor surface grown on the misoriented substrate results in the broad of the quantum level formed in the quantum well layer, or the unevenness of the carrier density confined in the quantum well layer. Accordingly, measures for preventing them are requested.

FIG. 2 is a schematic view showing the fundamental conception of the present invention. FIG. 2 merely shows the portions of a semiconductor multi-layer. Needless to say, various members necessary for a semiconductor laser device such as an electrode, a protective film of a light emitting surface and the like are provided on the semiconductor laminate in order to form a specific semiconductor light emitting device. Further, a semiconductor layer as desired, for example, a buffer layer for improving a crystallinity, and the like can be used as necessary. As shown in FIG. 2, a different-kind double junction structure composed of a plurality of optical waveguide layers 101, 104 (normally termed as a cladding layer) and an active layer 103 sandwiched therebetween, which is a fundamental structure of a semiconductor laser device, is provided on the misoriented semiconductor substrate 100. In the present invention, a multi-period super lattice thin film layer 102 is at least formed on the lower side of the light emitting active layer 103. Normally, a SCH layer 105 is inserted between the active layer 103 and the optical waveguide layer 104. It is noted that the aforementioned "on the lower side" means the crystal growth substrate side, that is, the misoriented substrate side.

FIG. 3 is a schematic view of a fundamental energy band structure according to the present invention. A multi-layer of a semiconductor shown in FIG. 3 corresponds to that of FIG. 1, and a multi-period super lattice thin film layer 102 is introduced on the crystal growth substrate side on the lower side with respect to the light emitting active layer 103. The layer 105 is a separate confinement heterostructure layer (normally called a SCH layer), which is not always necessary for the structure of a semiconductor laser device but is often used generally.

The main role of the multi-period super lattice thin film layer is to periodically repeat semiconductor thin film layers different in composition to obtain a multi-period super lattice thin film layer having a desired thickness to thereby suppress and reduce the oscillation of a film thickness stepwise caused by the step bunching as compared with the case of simply forming a semiconductor multi-layer. In the semiconductor thin film layers different in composition descrived above, one period comprises a combination of a layer having a large band gap (composition 1) and a layer having a band gap smaller than the former (composition 2). A number of one periods are multi-layerd to obtain the multi-period super lattice thin film layer.

In other words, the multi-period super lattice thin film layer comprises one kind of buffers which improves the mohorogy of an interface between a well layer and a barrier layer of a multi-quantum well type active layer formed thereon. When the multi-period super lattice thin film layer is introduced, the step bunching produced on the surface of the optical waveguide layer or the surface of the thin film guide layer under the active layer following the step on the misoriented substrate surface is not remained on a first well layer of the multi-quantum well structure active layer without modification, but the flatness or the interface acuteness of the semiconductor layer formed is considerably improved. Particularly, in a semiconductor material system in which an Al element which is slow in migration is contained in the optical waveguide, the guide layer or the quantum barrier layer, the introduction effect of the multi-period super lattice thin film layer is high.

For example, in a light emitting device comprising an AlGaInP system semiconductor crystal suitable for oscillation of a red laser beam, when it is provided on the misoriented substrate, an order arranging structure of a III group element is suppressed to materially enhance the homogeneity of crystals. On the other hand, however, in the crystalline system, particularly a cladding layer is composed of a four-dimensional crystal containing the Al element, and the step bunching tends to occur on the misoriented substrate. Then, when a multi-period super lattice thin film layer GaInP/AlGaInP system with a GaInP mixed crystal which a three-dimensional crystal not containing the Al element is formed and provided on the lower side in the vicinity of the light emitting active layer as described above, the step bunching suppression effect is obtained.

FIG. 4 shows the examined results of the light emitting characteristics from the active layer, in an example in which the multi-quantum well structure active layer and the multi-period super lattice thin film layer shown Embodiment 1 are provided, as one example, in FIGS. 2 and 3, in the semiconductor light emitting device comprising the GaInP/AlGaInp system material. The characteristic example of FIG. 4 indicates that the crystallinity of the active layer could be improved. The semiconductor light emitting device comprising the GaInP/AlGaInp system termed herein is a semiconductor light emitting device represented in a simplified form in which the active layer or the quantum well layer is formed of GaInP, and the cladding layer for confining a carrier and a light and the quantum barrier layer are formed of AlGaInP. As a result of measurement of a light emitting spectrum shown in FIG. 4, a spectrum II in FIG. 4 is obtained from a specimen into which is introduced the multi-period super lattice thin film layer as compared with a spectrum I into which is not introduced it. The light emitting intensity of the spectrum II increases by 4 to 5 times as compared with that of the spectrum I, and the half value width is reduced by 20 to 30%. As a result of observation of a transmission electron microscope image from a section of a specimen, the step bunching is suppressed on the multi-period super lattice thin film layer, and no difference in level of an irregular 2-atomic layer order is seen. As described above, the flatness and the interface acuteness of the quantum well layer were materially improved. With respect to the multi-quantum well structure in the case where the multi-period super lattice thin film layer is introduced, the improvement of the quality of crystal and the enhancement of the light emitting characteristics are clarified whereby an element contributed to the low threshold high efficiency operation of a laser element could be constructed.

FIG. 4 shows one example. In the quantum well layer which secures the flatness of the atom layer order, the relative light emitting intensity generally increases. On the other hand, in the case where a substrate having a step bunching is used, a spectrum is relatively broad and a light intensity is weak.

Secondly, the operation of the semiconductor laser element with the low threshold and high efficiency can be attained while making a good use of the multi-period super lattice thin film layer for designing the active layer.

Since the multi-period super lattice thin film layer is constituted by a super lattice well layer which is large in refractive index and small in forbidden band width, an optical confinement coefficient can be made large, and transportation of electron carriers within the active layer can be adjusted.

FIG. 5 shows the result of computation and comparison of the optical confinement coefficients in the GaInP/AlGaInP multi-quantum well structure as one example. In the figure, the axis of abscissae indicates the thickness of quantum well layers, and the axis of ordinates indicates the optical confinement coefficient. Curve 120 shows the change of the optical confinement coefficient in the case where an optical waveguide path is constituted having three quantum well layers. Curve 121 shows the change of the optical confinement coefficient in an example in which there are three quantum well layers, and the thin film super lattice layer according to the present invention for 10 periods (here, a set of a quantum well layer and a barrier layer is called one period) is provided on the crystalline substrate side of the active layer. Further, curve 122 shows the change of the optical confinement coefficient in the case where an optical waveguide path is constituted having three quantum well layers.

The cladding layer used is suffice to be one in a normal semiconductor laser device.

For example, a multi-period super lattice thin film layer provided with 11 AlGaInP super lattice barrier layers of thickness 1 nm and 10 GaInP super lattice well layers of thickness 0.5 nm is added to the structure of 3 quantum well layers of thickness 5 nm, whereby the optical confinement coefficient can be made large by 0.0051. This corresponds, in the case of only 3 quantum well layers, to the case where the thickness of the quantum well layer is increased by about 0.5 nm. Further, in the case where the thickness of the quantum well layer is not more than about 4 nm, substantially the same optical confinement coefficient as that of the structure of 4 quantum well layers is obtained. In FIG. 5, the characteristic of the structure having 3 quantum well layers is shown by curve 120, the characteristic of the structure having a multi-period super lattice thin film layer is shown by curve 121, and the characteristic of the structure having 4 quantum well layers is shown by curve 122. As described above, even if the characteristics 120 and 121 in FIG. 5 seem to be similar at a glance, a great effect is brought on in designing various semiconductor devices handling the quantum effect.

When a multi-period super lattice thin film layer is provided, an active layer structure can be designed in which a quantum well layer is increased falsely matching for one layer of the quantum well layer. In designing an active layer for reducing an optical density of the active layer to enhance the high output characteristic, there is set to a region where the optical confinement efficiency is relatively small. However, it is advantageous for the low threshold high efficiency operation of elements to make the optical confinement coefficient relatively large by the provision of the multi-period super lattice thin film layer. Further, since the number of carriers confined per quantum well layer unit can be increased, it is effective for the low threshold operation of elements.

Further, a multi-period super lattice thin film layer is provided on the upper side of an n-type optical waveguide layer on the lower side of an active layer whereby transportation of electron carriers injected from the n-type optical waveguide layer into the active layer can be adjusted. That is, since an electron carrier is smaller in effective mass and larger in mobility than those of a positive-hole carrier, a transportation speed in the active layer is high. Because of this, since the electron carriers are excessively injected into the active layer, a recouping light emitting progress on which induction release light is based is measured by the injection of positive-hole carriers. In the multi-period super lattice thin film layer provided on the n-type waveguide layer side, the electron carrier assumes a fallen trap state in the supper lattice well layer whose forbidden band width is small. Therefore, the quantity of transportation of electron carriers is relatively small, and it takes relatively long time for transportation. Within the active layer, the recoupling light emitting progress having been measured by the injection of positive-hole carriers is relieved, and the production amount of the optical gain with respect to the injection amount of electron and positive-hole carriers increases. Since this leads to a relative increase in differential gain, operation of elements with low threshold and high efficiency becomes enabled.

Thirdly, when a multi-period super lattice thin film layer is used, when an impurity diffusion area is formed, a diffusion front of the impurity is suppressed and stopped to thereby definitely provide a boundary of the impurity diffusion area.

In a semiconductor laser element, when an optical density is high, a facet of a resonator is broken to limit the maximum optical output. To avoid this, a window structure in which a laser beam is transparent in an area in the vicinity of the end of the resonator is formed. As a method for forming the window structure, there is a process for diffusing impurities to thereby form a multi-quantum well structure active layer in the vicinity of the end of the resonator into a mixed crystal. In the case where the process for diffusing impurities is used, it is important to control the quantity of diffused impurities in the active layer and a position of the diffused front. The multi-period super lattice thin film layer is introduced, and a thin film super lattice layer having an As system is used particularly for a V-group element whereby it can act as a diffusion stop layer of impurities.

Needless to say, it is necessary to enable making small the diffusion coefficient of impurities in which the multi-period super lattice thin film layer is introduced in order to fully function as the diffusion stop layer of impurities. The multi-period super lattice thin film layer has a smaller impurity diffusion coefficient than that of a semiconductor layer above the multi-period super lattice thin film layer to thereby fully function as the diffusion stop layer of impurities. Further, it is effective to introduce a compressed strain. To this end, a compound semiconductor containing arsenic (As) as a constituent element is particularly effective.

For the semiconductor light emitting device, a compound semiconductor material, particularly, a III–V group V group compound semiconductor material is often used. In this case, in a constituent element in which an optical waveguide layer or an active layer is constituted mainly by phosphorous (P), the effect of the multi-period super lattice thin film layer can be exhibited very effectively by making use of a difference in diffusion coefficient. The thin layer multiple super lattice layer is provided on the lower side of the active layer, that is, on the side of a crystal growth substrate whereby the diffusion front at the semiconductor multi-layer can be controlled. For example, in the semiconductor laser device, a mixed crystal of an active layer sometimes occurs by the diffusion of impurities, but such a diffusion has been diffused only in an area as desired, after which the diffusion can be stopped substantially. For example, the impurities are diffused from the top of a multi-layer surface of the semiconductor multi-layer, but the impurities are diffused also in a face direction of the laminated surface of the multi-layer. In this case, at the time when the impurities reach the multi-period super lattice thin film layer, the aforementioned diffusion processing is completed whereby the excessive quantity of impurities diffused on the active layer and an increase of internal optical loss of elements caused thereby can be avoided.

Further, in the case where p-type impurities are diffused, in an impurity diffusion area, a pn homo-junction is formed within an n-type optical waveguide layer in thee past. Therefore, a leak current through the pn-junction occurs. However, since in the present procedure, the diode characteristic of a pin in which the active layer internally comprises an undoped layer can be maintained, it is possible to suppress a turning leak current. Thereby, it is possible to obtain an element of a low threshold current or a low working current which suppresses a leak current as compared with a conventional element formed with a window structure. That is, it is possible to coexist the high output characteristic with the low threshold low current operation by way of the window structure.

By the devise and the design for fully exhibiting the role of the multi-period super lattice thin film layer, it is possible to obtain a light emitting device including semiconductor laser elements provided with the high output characteristic in combination of the low threshold high efficiency operation, which is suitable for a light source for an optical information processing apparatus and an optical communication system device.

It is noted that also in the following examples, as optical feedback means, an example of a so-called Fabry-Perot resonator using a cleavage plane is illustrated. However, the present invention can be carried out for a distributed feedback (DFB) type laser using a diffraction lattice, and a distributed bragg reflector (DBR) type laser.

The semiconductor light emitting device according to the present invention has been produced in consideration of various aspects as mentioned above. This light source is very useful as a light source for an optical information processing apparatus having at least a light source for irradiating light on a recording medium and a detector for detecting a reflecting light from the recording medium and having a function for reading a state change of a part of the recording medium, and a trans- and receive system apparatus for optical communication having at least a light source for transmitting light through an optical fiber as a signal and a detector for receiving a signal from the optical fiber.

Next, various matters as described above are put in order, and various typical forms of the semiconductor light emitting device according to the present invention will be listed (mentioned).

The semiconductor light emitting device according to the present invention includes a semiconductor substrate (a misoriented substrate) having a surface inclined from a fundamental crystalline surface and a periodical semiconductor super lattice thin film layer thereon, wherein at the upper part of the semiconductor super lattice thin film layer, a semiconductor crystalline film is formed with a light emitting layer area and a waveguide path structure.

The fundamental structure of the semiconductor light emitting device will be described in more detail hereinafter. This fundamental structure includes a semiconductor substrate (a misoriented substrate) having a step of an atomic layer order on the surface thereof and a periodic semiconductor super lattice thin film layer having a thickness of an atomic layer order formed thereon, wherein a stepwise non-periodic difference in level (called a step bunching appearing as a value of the atomic layer order) occurring in a growth surface of a semiconductor crystalline film (which is a connection interface when a light source is completed) formed on the semiconductor super lattice thin film layer is suppressed and relieved as compared with that of a semiconductor crystalline film formed on the lower side of the semiconductor super lattice thin film layer, and at the upper part of the semiconductor super lattice thin film layer, the semiconductor crystalline film is formed with a light emitting layer area and a waveguide path structure. That is, the thickness of the semiconductor crystalline layer provided on the semiconductor misoriented substrate is thicker in the vicinity of the step on the surface of the semiconductor misoriented substrate, the step bunching being suppressed or relieved.

The atomic layer order termed herein indicates, concretely, a thickness thinner than a so-called quantum well layer of not more than 20 Å or a quantum barrier layer, and a dimension equivalent thereto, the desirable range in the present invention being not more than 10 Å but less than 10 atomic layer.

The semiconductor super lattice thin film layer is preferably of the multi-period super lattice structure. Selection is made such that the period is from 5 to 30, and the whole thickness is from 5 nm to 50 nm. Particularly, in practice, the period is from 8 to 12, and the whole thickness is from 20 nm to 25 nm, which ranges are often used.

In the above-described semiconductor light emitting device, as one example in which the effect of the present invention is exhibited, there is a semiconductor misoriented substrate comprising a substrate material which has a main face in which appears a periodic step of an atomic layer order comprising terraces of (100) surface arranged stepwise and periodically, and whose inclination (an off angle) from the macroscopic (100) surface of the main face is in the range of 0° to 54.7°.

The surface state of the substrate will be described in more detail. The semiconductor misoriented substrate has terraces of (100) surface stepwise, an average angle inclined with the step of the atomic layer order which is off in the range of from larger than 0° to smaller than 54.7°, and a face orientation whose surface is off in the range of 0° to 54.7° Preferably, the range of the off angle is in the range of 5° to 25°.

As the semiconductor substrate, a substrate of GaAs or InP is practical. These substrate material sometimes contain some impurities, but these can be fully applied to the present invention as a substantial GaAs substrate or InP substrate.

In a semiconductor light emitting device of a GaInP/AlGaInP system in which a substrate material comprises GaAs or InP, the range of the off angle is set to the range of 5° to 25° whereby the effect of the present invention can be very effectively used in emitting light in a desired red area (600 to 680 nm).

Another example in which the effect of the present invention is particularly effective comprises the constitution of employment of a so-called quantum well type active layer in which a light emitting active layer having a small forbidden band width and an optical waveguide layer having a large forbidden band width sandwiching both upper and lower sides thereof are provided on the semiconductor super lattice thin film layer, and a waveguide path structure according to a use of the semiconductor light emitting device is provided on the optical waveguide layer.

Another form of the present invention provides the semiconductor light emitting device characterized in that a light emitting active layer having a small forbidden band width and an optical waveguide layer having a large forbidden band width sandwiching both upper and lower sides thereof are provided on the semiconductor misoriented substrate, and the semiconductor super lattice periodic thin film layer is provided on the upper side of the optical waveguide layer formed on the lower side of the light emitting active layer and is provided so as to be positioned on the lower side of the light emitting active layer to thereby provide a waveguide path structure of a semiconductor laser light source.

Still another form of the present invention provides the semiconductor light emitting device characterized in that the light emitting active layer is formed with a multi-quantum well structure, and a waveguide path structure in which the semiconductor super lattice periodic thin film layer is provided on the side of the semiconductor misoriented substrate is. constituted in proximity to the quantum well layer first provided on the multi-quantum well structure active layer.

Another form of the present invention provides the semiconductor light emitting device characterized in that in the waveguide path structure in which the semiconductor super lattice periodic thin film layer is introduced by the number of periods corresponding to the optical confinement coefficient for one layer portion of the quantum well layer of the multi-quantum well structure active layer to provide the semiconductor super lattice periodic thin film layer, the waveguide path structure equal in the optical confinement coefficient to that of the case where the quantum well layer of the multi-quantum well structure active layer is reduced by one layer as compared with the case where the semiconductor super lattice periodic thin film layer is not provided.

Still another form of the present invention provides the semiconductor light emitting device characterized in that the multi-quantum well structure constitutes the waveguide path structure in the form of a strained multi-quantum well structure in which at least a lattice strain is introduced into the quantum well layer.

Another form of the present invention provides the semiconductor light emitting device characterized in that the strain multi-quantum well structure is in the form of a strain multi-quantum well structure in which at least a lattice strain is introduced into the quantum well layer, and the quantum barrier layer is in the form of a strain compensation multi-quantum well structure in which a lattice strain having a symbol opposite to that of the quantum well layer is introduced.

In this case, preferably, a quantum energy formed in the semiconductor super lattice periodic thin film layer is set to be larger than a quantum energy in the quantum well structure active layer (including the optical waveguide layer).

It is practically recommended that a combination of the super lattice well layer constituting the semiconductor super lattice periodic thin film layer and a super lattice barrier layer having a larger forbidden band width than that of the former be selected from a group consisting of GaAs/AlGaAs, GaAsP/AlGaInAs, GaInAs/AlGaInAs, GaInAs/AlInAs, GaInAs/AlGaAsP, GaInP/AlGaInP, AlGaInP/AlGaInP, GaInAsP/GaInP, GaInAsP/GaInAsP, GaInAsP/InP, and GaInAs/InP.

The combination of the super lattice well layer constituting the semiconductor super lattice periodic thin film layer and a super lattice barrier layer having a larger forbidden band width than that of the former has been mentioned. In this case, however, preferably, an element As element is contained in either one of the super lattice well layer or the super lattice barrier layer of the semiconductor super lattice periodic thin film layer to thereby constitute a waveguide path structure.

Further, preferably, with respect to a so-called stripe-like waveguide path structure (hereinafter abbreviated as a stripe area) formed in the light emitting active layer or the optical waveguide layer of the semiconductor light emitting device, impurities are diffused and introduced into the light emitting active layer area at the lower part of the stripe area in the vicinity of the end of the resonator to make the forbidden band width of the impurity diffusion area larger than that of the region in which the impurity is not diffused and to make larger than energy of a laser beam generated in the resonator in which the impurity is not diffused so as to form a window structure for releasing the laser beam. Preferably, a difference between the forbidden band width of the area in which the impurity is introduced and the energy of the laser beam generated in the resonator is set to at least not less than 50 meV. Preferably, with respect to the window structure area at the lower part of the stripe, a current non-injection area is provided, at the upper part or lower part thereof, while extending longer into the resonator than the window structure area.

BRIEF DESCRIPTION OF THE DRAWINGS

FIG. 3 is a schematic view showing an energy band structure of a multi-quantum well active layer according to the present invention.

PREFERRED EMBODIMENTS OF THE INVENTION

Specific embodiments of the present invention will now be described with reference to the respective relative drawings.

Embodiment 1

Figure 1:
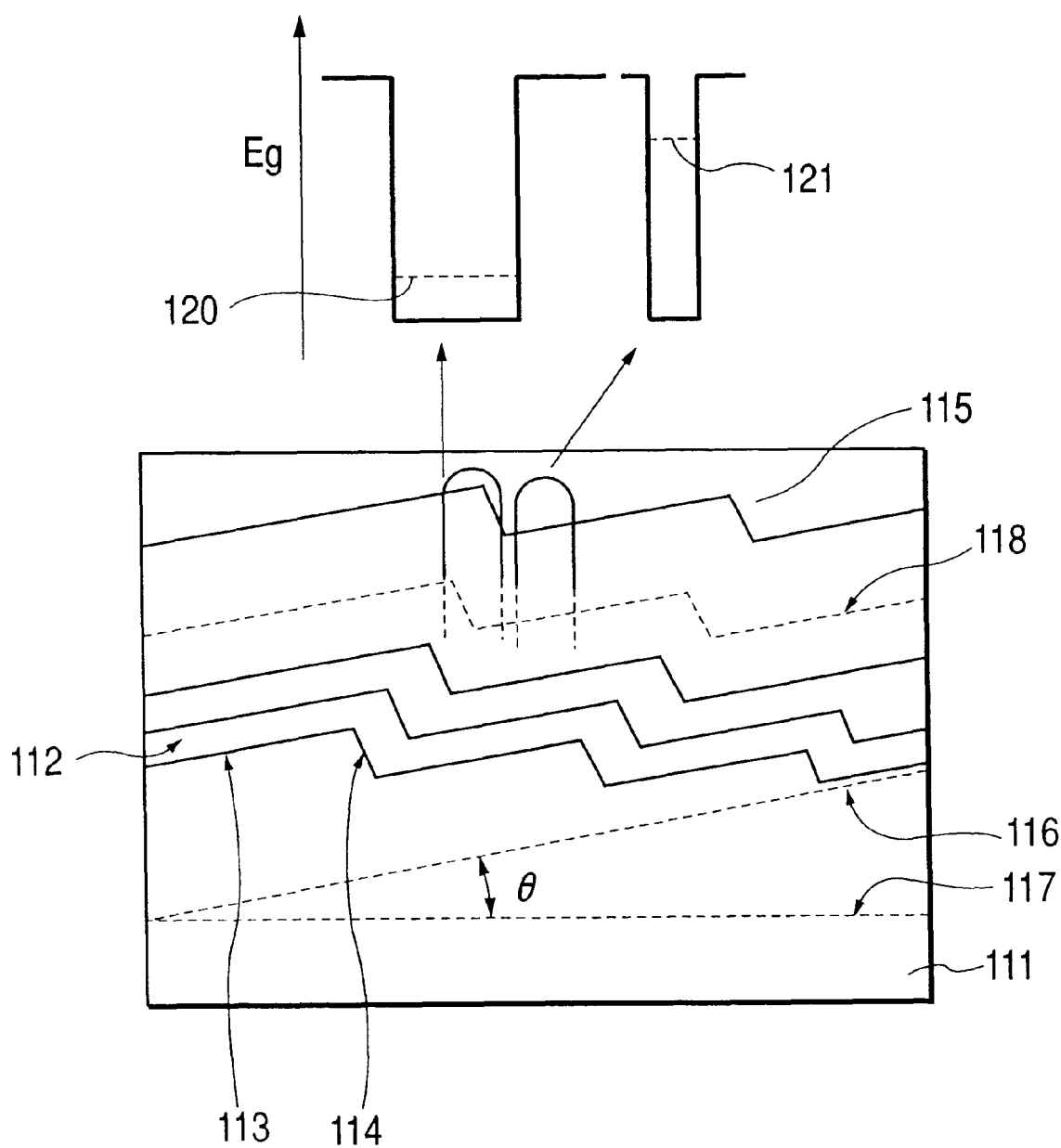
FIG. 1 is an explanatory view of a step bunching.
Figure 2:
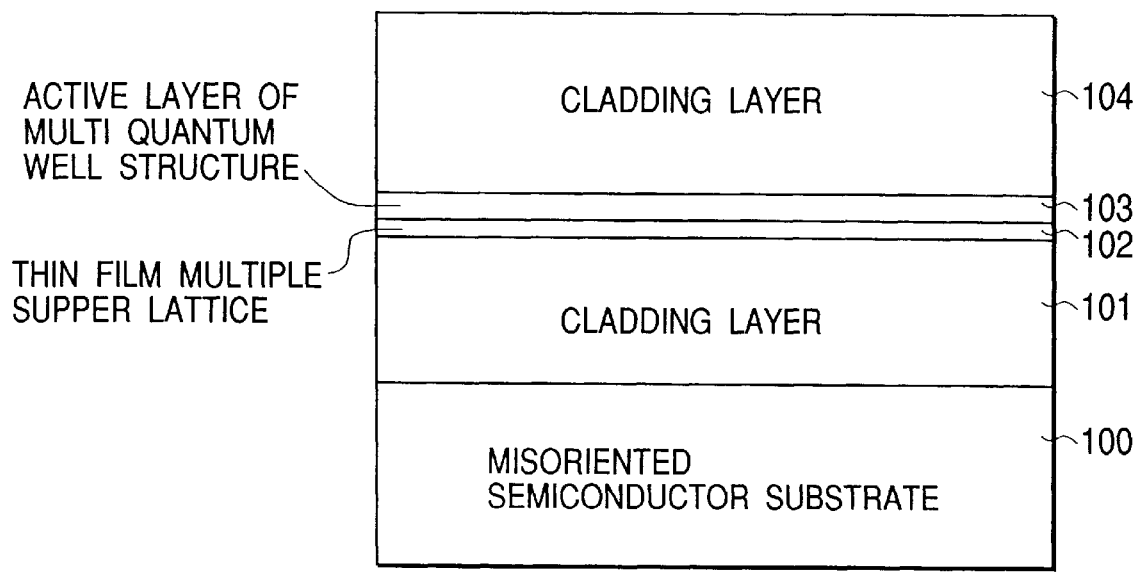
FIG. 2 is a sectional view showing the fundamental structure of a semiconductor multi-layer according to one embodiment of the present invention.
Figure 4:
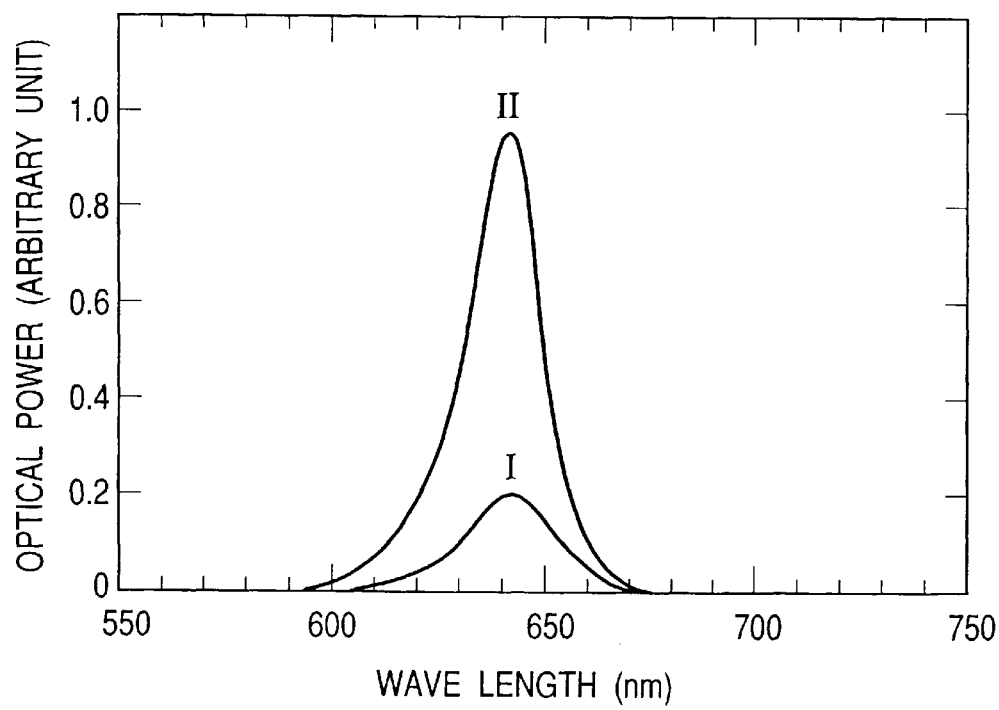
FIG. 4 is a view showing an example of measurement of a light emitting spectrum in an example of an active layer according to the present invention.
Figure 5:
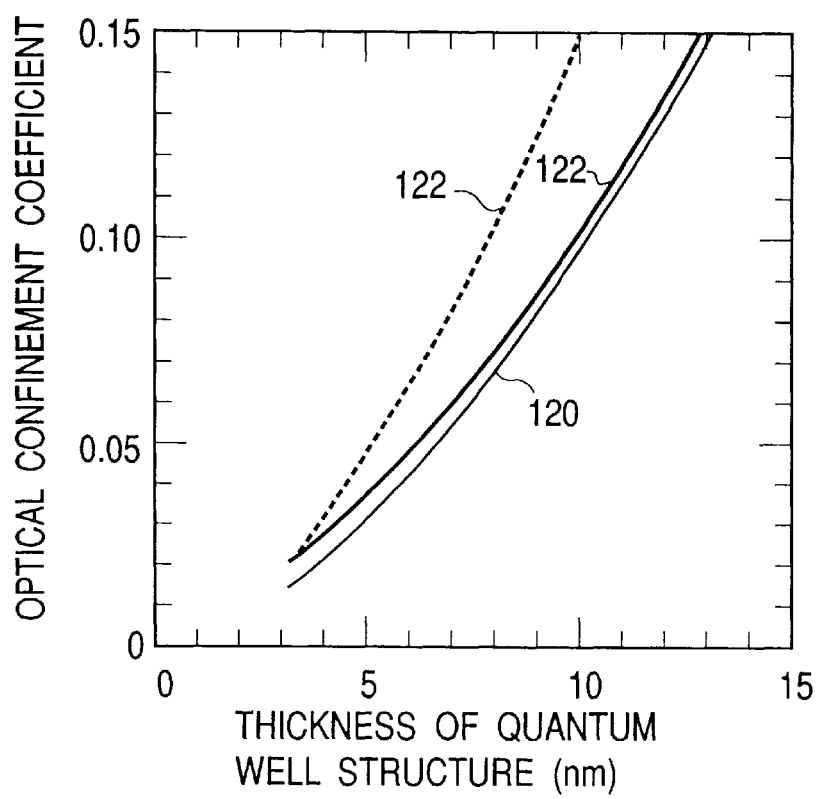
FIG. 5 is a view showing a relationship between an optical confinement coefficient and a quantum well layer thickness of the multi-quantum well structure active layer according to the present invention.
Figure 6:
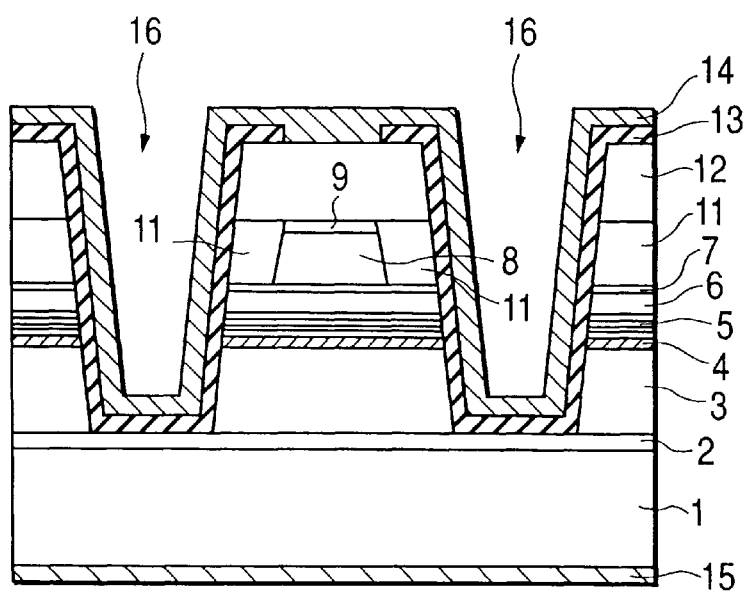
FIG. 6 is a sectional view of a face crossing an optical axis in a resonator according to one embodiment of the present invention.
Figure 7:
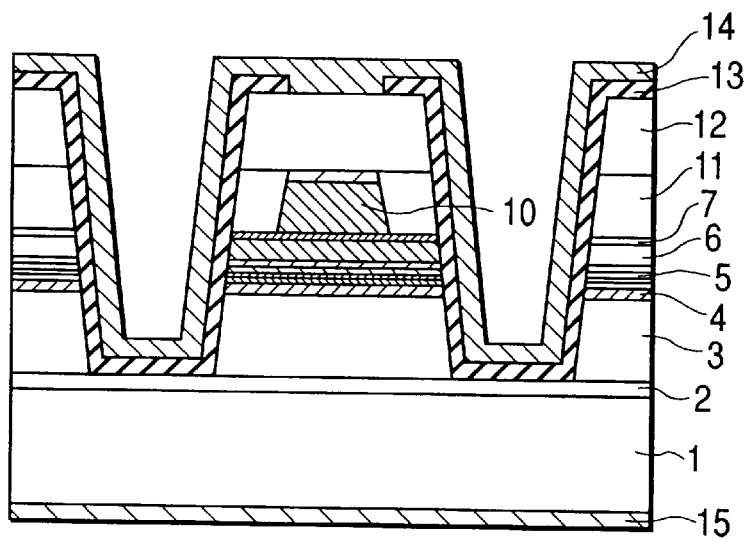
FIG. 7 is a sectional view of a face crossing an optical axis in an end of a resonator according to one embodiment of the present invention.
Figure 8:
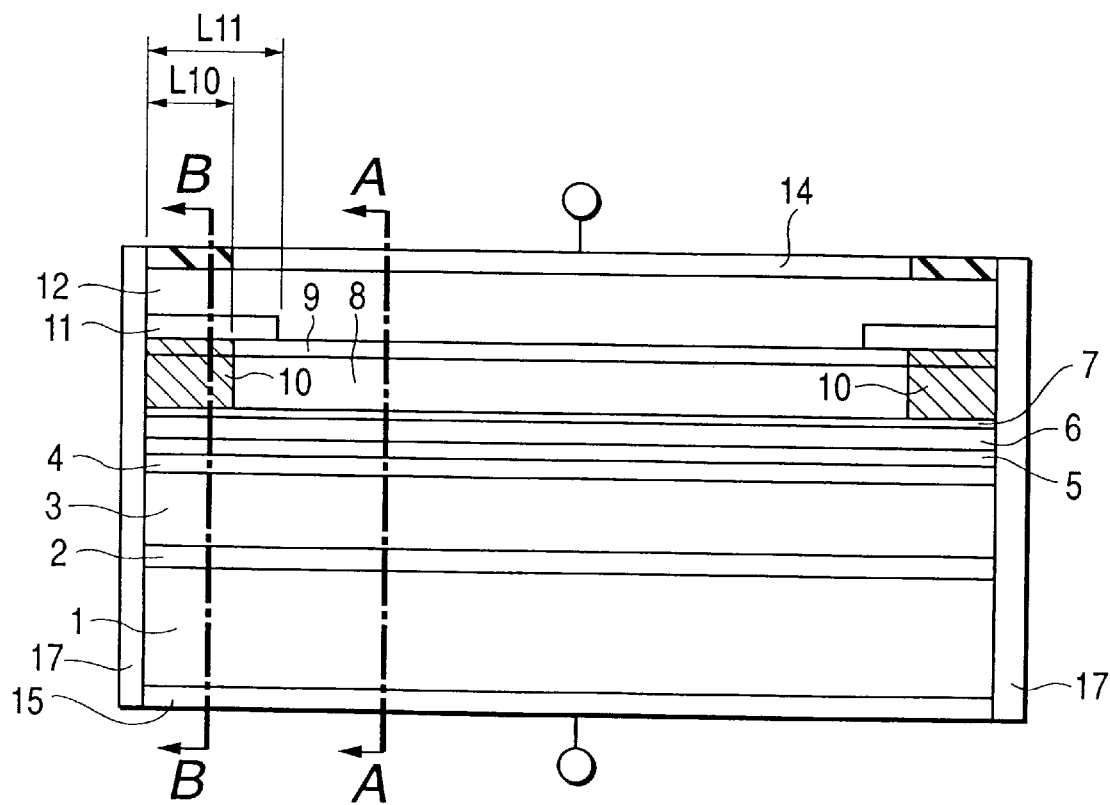
FIG. 8 is a sectional view at a face parallel to an optical axis of a resonator in an embodiment according to the present invention.
Figure 9:
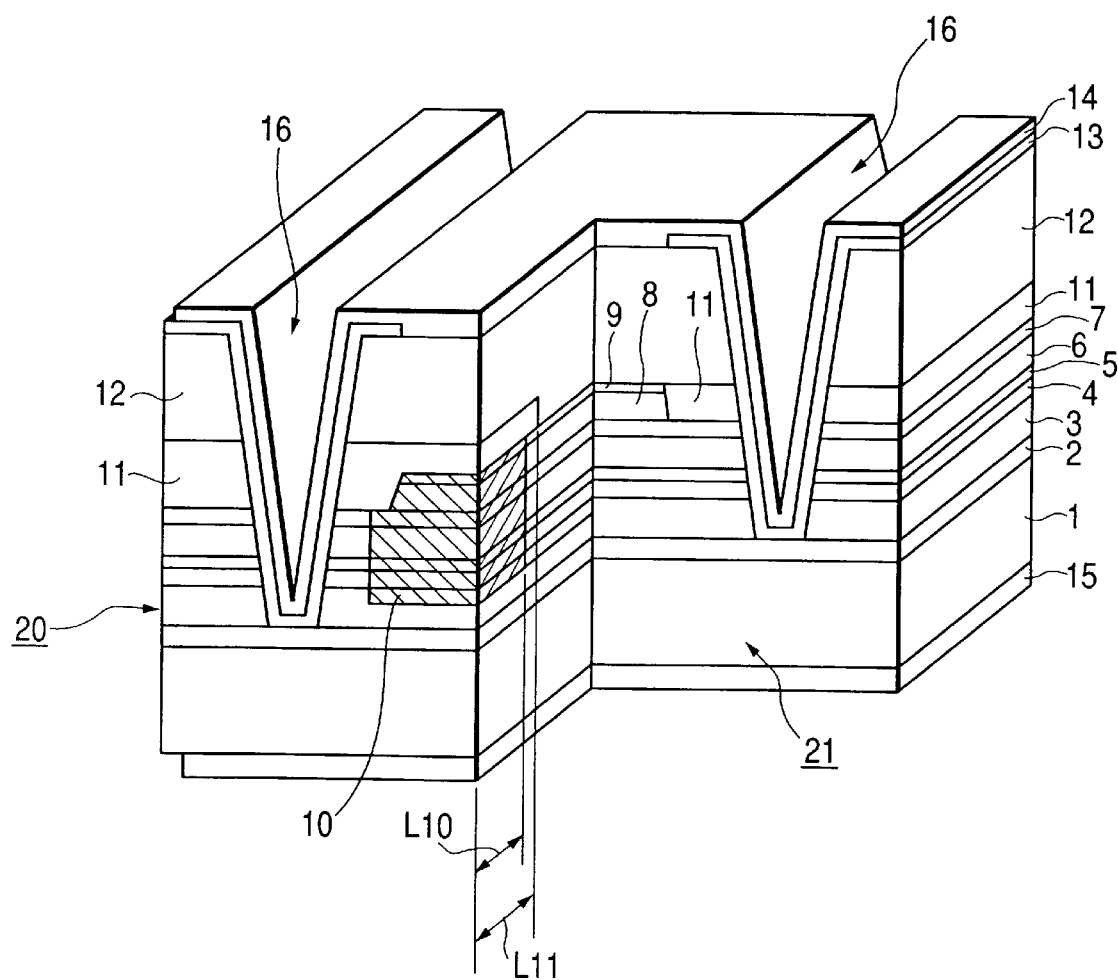
FIG. 9 is a perspective view of one embodiment according to the present invention.

One embodiment of the present invention will be explained with reference to FIGS. 6 to 9. FIG. 6 is a sectional view at a face crossing an optical axis in an optical resonator according to the present embodiment. FIG. 7 is a sectional view at a face crossing an optical axis in an end of an optical resonator of a semiconductor laminate having the diffusion of impurities finished. FIG. 8 is a sectional view at a face parallel to an optical axis in an optical resonator according to the present example. FIG. 9 is a perspective view of this embodiment.

FIG. 6 is a sectional view taken on line A—A of FIG. 8, and FIG. 7 is a sectional view taken on line B—B of FIG. 8. The section taken on line A—A is a perspective view, which corresponds to the surface 21 of FIG. 9 and the section taken on line B—B is a perspective view, which corresponds to the surface 20 of FIG. 9.

On an n-type GaAs misoriented substrate 1 offed 10° from the (100) surface orientation, an n-type GaAs buffer layer 2 of thickness 0.5 $\mu$m, an n-type AlGaInP optical waveguide layer 3 of thickness 2 $\mu$m, a super lattice periodic thin film layer 4, a multi-quantum well structure active layer 5, a p-type AlGaInP optical waveguide layer 6 of thickness 0.3 $\mu$m, a p-type AlGaInP etching stop layer 7 of thickness 0.05 $\mu$m, a p-type AlGaInP optical waveguide layer 8 of thickness 1.3 $\mu$m, and a p-type AlGaInP layer 9 of thickness 0.05 $\mu$m are subjected to epitaxial growth in said order by an organic metal gas-phase growth (MOVPE) method. The super lattice periodic periodic thin film layer 4 is formed by alternately laminating an undoped AlGaInP super lattice barrier layer of thickness 1 nm and an undoped GaIn super lattice well layer of thickness 0.5 nm. In the present embodiment, there are 11 super lattice barrier layers, and 10 super lattice well layers. The super lattice periodic thin film layer 4 and the multi-quantum well structure active layer 5 employ an energy band structure shown in FIG. 3. This super lattice periodic thin film layer 4 is an important layer according to the present invention. The multi-quantum well structure active layer 5 comprises 3 undoped compression strain GaInP quantum well layers of thickness 5 nm, 4 tensile strain AlGaInP quantum barrier layers of thickness 4 nm, and a non-strain AlGaInP optical confinement layer. This optical confinement layer corresponds to a SCH layer 105 shown in FIG. 3.

Next, a diffusion mask is formed, using a normal photolithography process, on the thus prepared semiconductor substrate (which indicates a semiconductor multi-layer extending from the substrate 1 to the semiconductor layer 9). Thereafter, a ZnO solid diffusion source is deposited thereon and is subjected to heat treatment at a temperature of 500 to 600° C. Then, a zn impurity diffusion area 10 is provided on an area corresponding to each of both ends of a resonator in FIG. 7.

The impurity diffusion area 10 is formed and the diffusion source is removed, and after this, a ridge stripe construction common to the interior and the ends of the resonator is provided. The layers 8 and 9 are removed by a normal photolithography process and etching process to the layer 7 with respect to a desired area of a semiconductor layer extending from the substrate 1 to the semiconductor layer 9. In this manner, a stripe shown in FIGS. 6 and 7 (the stripe is constituted by the layers 8 and 9) is formed. This stripe has a long axis in a direction of an optical axis. Then, an n-type GaAs current bottleneck layer 11 of thickness 1.3 $\mu$m is selectively grown by the MOVPE method on both sides of the stripe. At that time, the layer 11 is placed to be left over the ridge stripe as shown in FIG. 7 on the impurity diffusion area of the end of the resonator by the photolithography process and the etching process.

The layer 11 is provided longer (L11) in a direction of a resonator than a length (L10) in a direction of a resonator of the impurity diffusion area 10, and a non-injection area into which no current is injected is set in the impurity diffusion area 10 of the end of a resonator. This can be readily understood from FIGS. 8 and 9.

For obtaining the effect of the window structure without remarkably increasing the internal optical loss of a laser beam, it is necessary to set the length of the impurity diffusion area 10 to an optimum range of 5 to 40 μm, preferably, 10 to 30 μm. For making the impurity diffusion area 10 of the end of the resonator a non-injection area, the length of the layer 11 is set to be longer by 5 to 30 μm, preferably, 10 to 20 μm than the length in a direction of the resonator of the impurity diffusion area 10.

Next, after a p-type GaAs contact layer 12 of thickness 3 μm is embedded by the MOVPE method, grooves 16 for reducing the element capacity are formed on both sides of the stripe. Formation of the grooves can be done by the normal photolithography process and the etching process. Thereafter, an insulating film mask 13 is formed into a desired shape, and a p-side electrode 14 and an n-side electrode 15 are deposited. An element can be cut out by a cleavage scribe to obtain a semiconductor laser device. Layers 17 in FIG. 8 are protective films of the ends. A normal protective film in the semiconductor laser device suffices for the protection film. A perspective view of FIG. 9 shows no protective films.

According to the present embodiment, the super lattice periodic thin film layer was provided at least on the lower side of the active layer whereby the step bunching could be suppressed on the misoriented substrate to improve the flatness and interface acuteness of the quantum well layer. When the light emitting spectrum from the active layer was measured, the light emitting intensity was increased by 4 to 5 times, and the half value width was reduced by 20 to 30% as compared with the case where the super lattice thin film layer was not introduced. Thereby, the low threshold and high efficiency operation of elements became enabled. That is, a threshold current of elements could be reduced by 20 to 30% and the quantum efficiency was enhanced by 20 to 30% as compared with a semiconductor laser device to which the present invention was not applied.

For avoiding the breakage of the end, in an active layer area having an area from which impurities were diffused the output end to be transparent, a window structure was formed in which the forbidden band width was made larger by 60 meV to 120 meV than the interior of a resonator. By the effect of the window structure, the end breakage phenomenon was suppressed to enhance the maximum optical output till an optical output saturation caused by heat could be seen. In the present embodiment, there was realized the stable high output characteristic which secured the maximum optical output from 2.5 to 4 times as compared with the case where the window structure was not provided.

The present element oscillated at wavelength of 650 to 660 nm, and a threshold current at room temperature was from 30 to 40 mA, the maximum optical output was 200 to 300 mW, and even at a temperature of 80° C., the high output stable operation of 70 mW was possible continuously over 5000 hours or more.

EMBODIMENT 2

Another embodiment of the present invention will be described. In the present embodiment, an element is prepared basically similarly to Embodiment 1 except that the layer 4 comprises a super lattice periodic thin film layer composed of 10 undoped AlGaInP super lattice barrier layers and 11 undoped GaInAsP super lattice well layers containing an element As. Others are totally same as Embodiment 1 to prepare an element.

In the present embodiment, the flatness and the interface acuteness of the quantum well layer in the multi-quantum well structure active layer are improved to enhance the quality of the active layer similar to Embodiment 1, as a result of which the low threshold and high efficiency operation becomes enabled. A window structure as shown in Embodiment 1 is prepared by the diffusion of impurities to the semiconductor multi-layer. The processing conditions that the diffusion front of the impurity Zn is suppressed by the super lattice periodic thin film layer so as not to reach the n-type optical waveguide layer 3 is easily set. Thereby, in the end of the resonator provided with the window structure, the diffusion front is formed in the n-type waveguide layer to avoid the pn homo-junction. Therefore, it is possible to prevent a leak current from the pn homo-junction which exhibits no diode characteristic. As a result, in the present element, by the increase of the forbidden band width of the window structure area, the end breakage phenomenon was totally suppressed to draw the maximum optical output to a heat saturation level, and to suppress the leak current to obtain a low operation current also. The operating current in the present embodiment was reduced by 5 to 10% as compared with Embodiment 1.

The present element oscillated at wavelength of 650 to 660 nm, and a threshold current at room temperature was from 25 to 35 mA, the maximum optical output was 200 to 250 mW, and even at a temperature of 80° C., the high output stable operation of 60 mW was possible continuously over 10000 hours or more.

EMBODIMENT 3

Another embodiment of the present invention will be described. In the present embodiment, an element is prepared basically similarly to Embodiment 2 except that a multi-quantum well structure active layer as will be mentioned below is used. The multi-quantum well structure comprises an active layer comprising 2 undoped tension strain GaInP quantum well layers of thickness 10 nm and 3 compression strain AlGaInP quantum barrier layers of thickness 4 nm, and a non-strain AlGaInP optical confinement layer of thickness of 10 nm. Others are totally similar to Embodiment 2 to prepare an element.

According to the present embodiment, the low threshold and high efficiency operation and the high output characteristic were achieved by the effect similar to Embodiments 1 and 2. The present element oscillates at wavelength of 630 to 640 nm, and a threshold current at room temperature was from 40 to 50 mA, the maximum optical output was 150 to 200 mW, and even at a temperature of 80° C., the high output stable operation of 50 mW was possible continuously over 5000 hours or more.

EMBODIMENT 4

Another embodiments of the present invention will be described with reference to FIGS. 6 and 7 mentioned above. The step of preparing an element is similar to those shown in Embodiments 1 to 3.

As shown in FIG. 9, on an n-type GaAs misoriented substrate 1 offed 5° from the (100) surface orientation, an n-type GaAs buffer layer 2 of thickness 0.5 μm, an n-type GaInP optical waveguide layer 3 of thickness 2 μm, a super lattice periodic thin film layer 4, a multi-quantum well structure active layer 5, a p-type GaInP optical waveguide layer 6 of thickness 0.3 μm, a p-type GaAs etching stop layer 7 of thickness 0.05 μm, a p-type GaInP optical waveguide layer 8 of thickness 1.6 μm, and a p-type GaInAsP layer 9 of thickness 0.05 μm are subjected to epitaxial growth in said order by the MOVPE method. The super lattice periodic thin film layer 4 comprises 11 undoped GaInAsP super lattice barrier layers of thickness 1 nm and 10 undoped GaInAs super lattice well layers of thickness 0.5 nm. The multi-quantum well structure active layer 5 comprises an undoped compression strain GaInAs quantum well layer of thickness 7 nm, 2 tensile strain GaInAsP quantum barrier layers of thickness 10 nm, and a non-strain GaAs optical confinement layer of thickness 20 nm. This optical confinement layer corresponds to a SCH layer 105 shown in FIG. 3.

Next, after the impurity diffusion area 10 is formed in each of both ends of the resonator, in a manner similar to Embodiments 1 to 3, a stripe shown in FIGS. 6 and 7 (areas of numerals 8 and 9) is formed. The impurity diffusion area 10 is shown in FIG. 7. The method of forming a stripe is similar to the previous embodiment.

Next, n-type GaInp current bottleneck layers 11 of thickness 1.6 μm are selectively grown by the MOVPE method on both sides of the stripe, and a p-type GaAs contact layer 12 of thickness 3 μm is embedded. Then elements in section shown in FIGS. 6 and 7 respectively corresponding to the interior of the resonator and the end of the resonator are obtained in exactly the same manner as Embodiments 1 to 3.

According to the present embodiment, the operation with low threshold and high efficiency and the high output characteristic could be achieved by the effect similar to Embodiments 1 to 3. The element of the present embodiment oscillated at wavelength 975 to 985 nm, a threshold current at room temperature was 15 to 25 mA, a maximum optical output was 850 to 950 mW, and even at a temperature of 90° C., the high output stable operation at 300 mW was possible which continued more than 10000 hours.

EMBODIMENT 5

Another embodiment of the present invention will be described with reference to FIGS. 6 and 7 mentioned above. The step of preparing an element is similar to those shown in Embodiments 1 to 3.

As shown in FIG. 6, on an n-type InP misoriented substrate 1 offed 25° from the (100) surface orientation, an n-type InP buffer layer 2 of thickness 0.5 μm, an n-type InP optical waveguide layer 3 of thickness 2 μm, a super lattice periodic thin film layer 4, a multi-quantum well structure active layer 5, a p-type InP optical waveguide layer 6 of thickness 0.3 μm, a p-type GaInAsP etching stop layer 7 of thickness 0.05 μm, a p-type InP optical waveguide layer 11 of thickness 1.5 μm, and a p-type GaInAsP layer 12 of thickness 0.05 μm are subjected to epitaxial growth in said order by the MOVPE method. The super lattice periodic thin film layer 4 comprises 11 undoped GaInAsP super lattice barrier layers of thickness 1 nm and 10 undoped GaInAs super lattice well layers of thickness 0.5 nm. The multi-quantum well structure active layer 5 comprises 3 undoped compression strain GaInAsP quantum well layers of thickness 6 nm, 4 tensile strain GaInAsP quantum barrier layers of thickness 4 nm, and a non-strain GaInAsP optical confinement layer of thickness 30 nm. This optical confinement layer corresponds to a SCH layer 105 shown in FIG. 3.

Next, after the impurity diffusion area 10 in FIG. 7 is formed in both ends of the resonator, in a manner similar to Embodiments 1 to 4, stripes shown in FIGS. 6 and 7 (area of numerals 8 and 9) is formed. Next, n-type InP current bottleneck layers 17 of thickness 1.5 μm shown in FIGS. 6 and 7 are selectively grown by the MOVPE method on both sides of the stripe, and a p-type GaInAs contact layer of thickness 1 μm is embedded. Then elements in section shown in FIGS. 6 and 7 respectively corresponding to the interior of the resonator and the end of the resonator are obtained in exactly the same manner as Embodiments 1 to 4.

According to the present embodiment, the operation with low threshold and high efficiency and the high output characteristic could be achieved by the effect similar to Embodiments 1 to 4. The element of the present embodiment oscillated at wavelength 1310 to 1330 nm, a threshold current at room temperature was 15 to 25 mA, a maximum optical output was 90 to 150 mW, and even at a temperature of 90° C., the high output stable operation at 50 mW was possible which continued more than 10000 hours.

EMBODIMENT 6

The semiconductor laser device according to the present invention was mounted as a light source on an optical disk drive device to evaluate an operation reliance test of a rewritable optical disk. As a result, The present optical disk drive device achieved more than $10^6$ times of rewriting even at an operating temperature of 80° C. and continued a continuous operation for 10000 hours or more stably. The semiconductor laser device fulfilled with the desired characteristic of the optical disk drive device sufficiently even the laser device described in either of Embodiments 1 to 3.

The constitution of the optical information processing system will be explained hereinafter.

Figure 10:
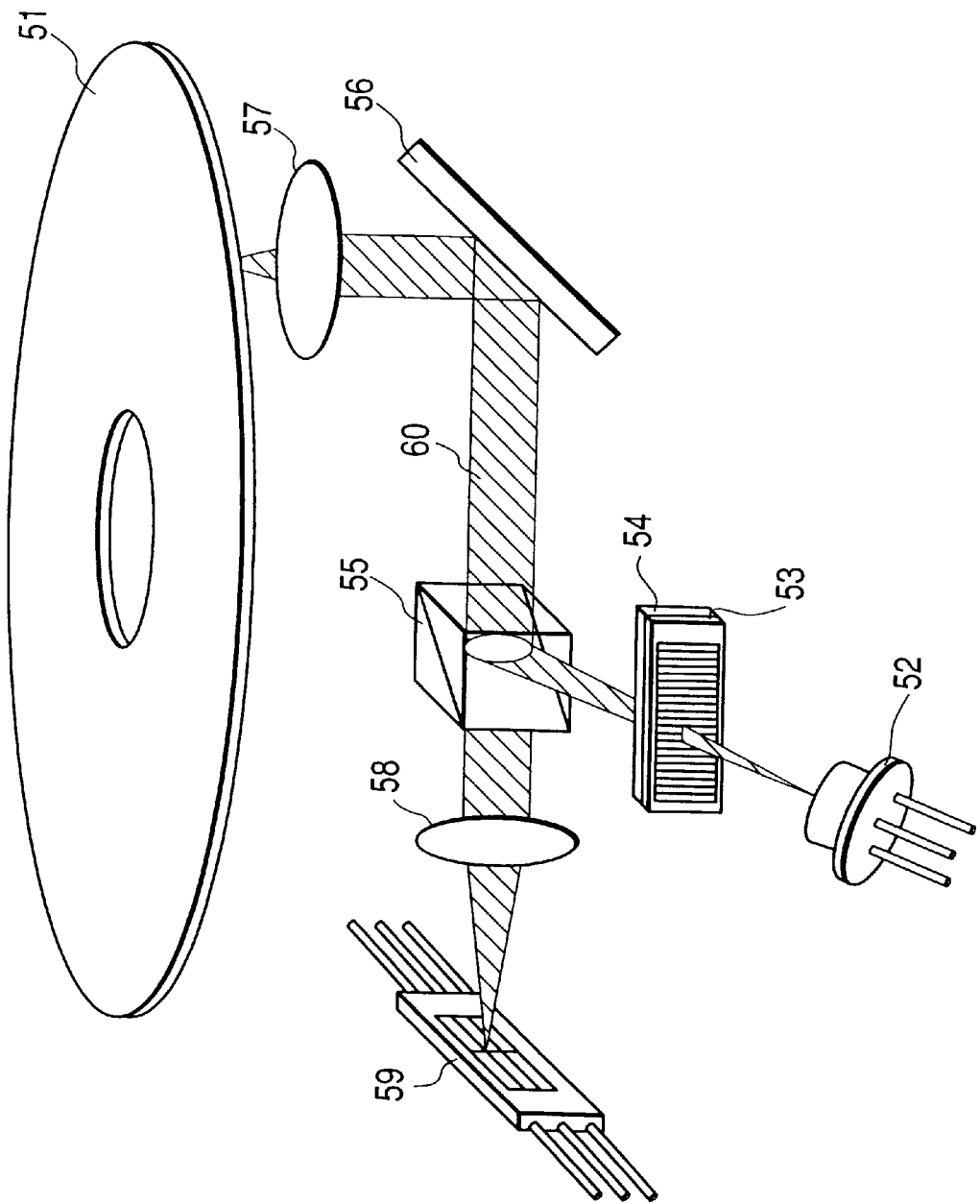
FIG. 10 is a schematic explanatory view showing an example of an optical disk device.

FIG. 10 is a basic structural view showing an example of the optical disk device. Numeral 51 designates a disk provided with an optical recording medium for optical recording, which is rotated by a motor. A laser beam from a light source 52 reaches a splitter 55 via a polarization separating diffraction grating 53 and a λ/4 plate 54. For writing into the disk 51, a laser beam is split and is irradiated on the disk 51 at the desired optical intensity through a mirror 56 and a convex lens 57. On the other hand, monitoring is carried out by a light reached a light receiving element 59 via a convex lens 58 from the beam splitter 55. An area 60 indicated by diagonal lines in FIG. 10 shows a light path of a laser beam.

The general matter of the optical disk device has been variously reported, which is however omitted. The optical disk device is generally divided into a ROM type, an addition type, and a rewritable type, according to the kind of recording materials. Reproduction of information in the example in the FIG. 10 is carried out by optically reading, by an optical detector, a change of reflecting light from fine pores (a state changing portion of a recording medium) recorded in the disk 51. An optical recording medium used is of a normal type.

In the case of the ROM type, recording information is recorded in advance in the recording medium. For example, typical ROM type recording media include aluminum, plastics, and the like.

In recording, a laser beam is diaphragmed in a fine optical point, and the laser beam is modulated in accordance with the information to be recorded to thereby thermally change the state of recording material and record in train. This recording is carried out while rotating (moving) the disk by the motor. For such a light source as described, a light source according to the present invention can be used.

Figure 11:
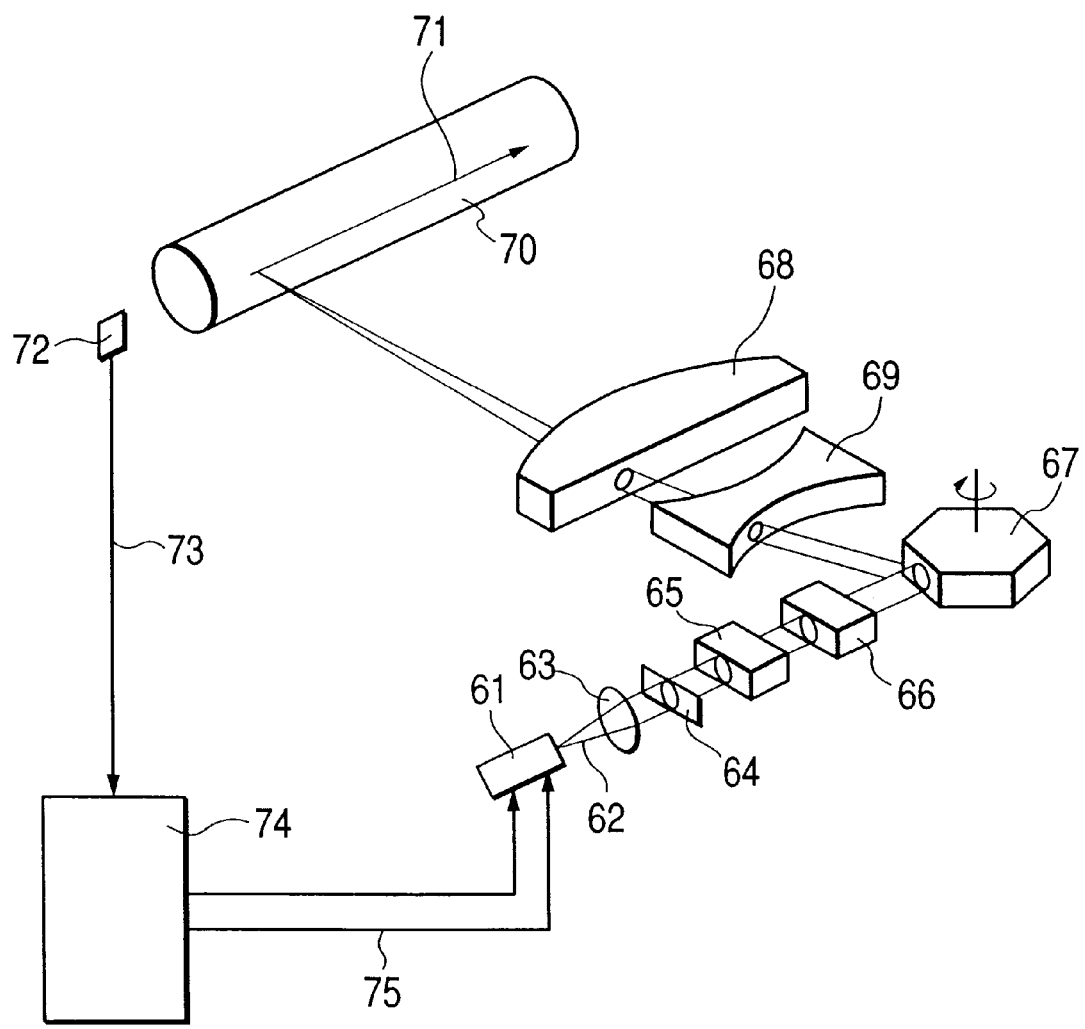
FIG. 11 is a schematic explanatory view showing an example of a laser beam printer.

FIG. 11 is a system structural view showing an example of a laser beam printer. The light source of the present invention can be used as a light source for the laser beam printer. In a laser beam printer (LBP) device, a photosensitive drum is scanned using a mirror and a lens system to record information. Information recorded on the photosensitive drum is transferred to a photosensitive sheet for printing.

A laser beam 62 from a semiconductor laser device 61 being controlled by a control section 74 is irradiated on a polygon mirror 67 via lens systems 63, 64, 65 and 66. The laser beam reflected by the polygon mirror 67 is irradiated on a photosensitive drum 70 through a toroidal and f θ lens 68. At this time, the laser beam is scanned on the photosensitive drum 70 as indicated by arrow 71.

The semiconductor laser device according to the present invention can be mounted on the laser beam printer device to render it cheap, small, light-weight, and compact. The semiconductor laser device fulfills the desired characteristics of the laser beam printer device fully even any laser device described in Embodiments 1 to3.

EMBODIMENT 7

An optical amplifier of a transmission system device was constituted by the semiconductor laser element of Embodiment 5 in the present invention as a light source for evaluation. As a result, at the fiber outgoing end of the optical amplifier device whose light source was the present element, optical output not less than 100 mW at an operating temperature of 90° C. was achieved.

Figure 12:
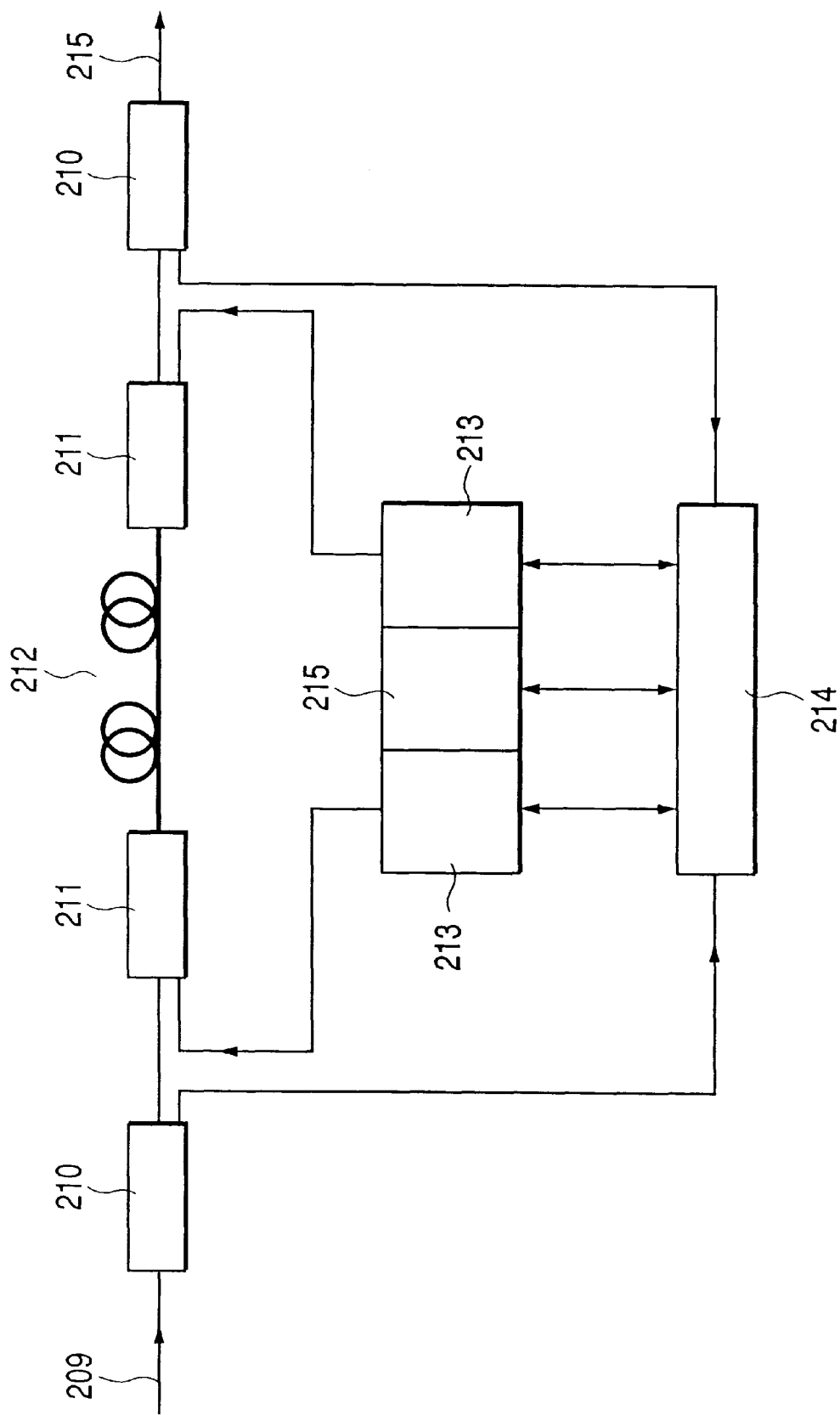
FIG. 12 is an explanatory view showing an example of an optical communication system.

A bilateral optical transmission system using an optical transmission device according to the present embodiment will be explained. FIG. 12 schematically shows an optical transmission, transmitting and receiving system. Since an optical input 209 is generally multi-transmitted, a light having a fixed wavelength is branched by a de-multiplexer 210. The optical input 209 is used as the aforementioned light source. A laser beam which is incident from a semiconductor laser device 213 to amplify a fiber amplifier 212 and an input light are mixed by a multiplexer(mixer) 211, and is input into the fiber amplifier. The semiconductor laser device 213 is generally cooled by a cooler 215, and these elements are controlled by an automatic controller 214.

In general, on the transmitting side, carrier waves in which a channel is modulated by an original signal on the frequency axis are assigned and arranged in order, and transmission signals are synthesized by an optical synthesizer. On the other hand, on the receiving side, a signal separated in frequency by a dividing filter is passed through an optical detection and demodulation circuit provided in each channel to reproduce an original signal. In this manner, a bilateral optical transmission system can be constituted.

Further transmission system device for an optical subscriber is constituted by the laser element as a light source in Embodiment 6 of the present invention for evaluation. As a a result of which an optical output not less than 20 mW at an operating temperature of 90° C. was achieved at a transmission module fiber outgoing end.

Various forms of embodiments according to the present invention have been described in conjunction with Embodiments 1 to 7. The effectiveness of these forms are summarized as follows:

According to the present invention, the step bunching can be suppressed by the provision of the super lattice periodic thin film layer to improve the flatness and interface acuteness of the quantum well layer formed on the misoriented substrate. In the light emitting spectrum from the active layer, the light emitting intensity is increased by 4 to 5 times, and the half value width is reduced by 20 to 30% as compared with the case where the present process is not applied. Thereby, the low threshold and high efficiency operation, in which the threshold current of the laser element is reduced by 20 to 30% and the quantum efficiency is enhanced by 20 to 30%, becomes enabled.

Further, the active layer area with impurities diffused is formed in the end of the resonator to thereby form the window structure having the forbidden band width enlarged by 60 to 120 meV as compared with the interior of the resonator, as a result of which the end breakage can be avoided, and the maximum optical output is enhanced till the optical output saturation caused by heat can be seen. As compared with the case where the window structure is not provided, the high output characteristic having the maximum optical output increased by 2.5 to 4 times is achieved, and the coexistence with the low threshold and high efficiency operation becomes enabled.

The rewritable optical disk drive device with the present element mounted as a light source achieves not less than $10^6$ times of writing even at an operating temperature of 80° C., and stably continues a continuous operation for more than 10000 hours. Further, in the optical amplifier of the transmission system device with the present element as a light source, the optical output not less than 100 mW at the fiber outgoing end is achieved at an operating temperature of 90° C., and in the system device with the present element as a light source, the optical output not less than 20 mW at the fiber outgoing end is achieved at an operating temperature of 90° C.

What is claimed is:

1. A semiconductor light emitting device comprising:
   a semiconductor misoriented substrate;
   a semiconductor superlattice thin film layer having a thickness in an atomic layer order provided over said semiconductor misoriented substrate, said semiconductor superlattice thin film layer having a flatness in an atomic layer order at least on the opposite side of said semiconductor misoriented substrate; and
   a semiconductor multi-layer having at least a light emitting layer provided on said semiconductor super lattice thin film layer, said light emitting layer having a flatness in an atomic layer order.

2. A semiconductor light emitting device according to claim 1, wherein said semiconductor misoriented substrate has terraces of a (100) surface stepwise, said surface being a GaAs substrate or an InP substrate of the surface orientation offed at an angle in the range of 0° to 54.7° from the (100) surface.

3. A semiconductor light emitting device according to claim 1, wherein said semiconductor misoriented substrate has terraces of a (100) surface stepwise, said surface being a GaAs substrate or an InP substrate of the surface orientation offed at an angle in the range of 5° to 25° from the (100) surface.

4. A semiconductor light emitting device according to claim 1, wherein said semiconductor misoriented substrate has thereon a first optical waveguide layer, a light emitting active layer, and a second optical waveguide layer, a forbidden band width of said light emitting active layer is smaller than those of said first and second optical waveguide layers, and said semiconductor superlattice thin film layer is at least provided on a lower side of said light emitting active layer.

5. A semiconductor light emitting device according to claim 4, wherein said semiconductor superlattice thin film layer is provided to be positioned on an upper side of the optical waveguide layer formed on the lower side of said light emitting active layer and on the lower side of said light emitting active layer.

6. A semiconductor light emitting device according to claim 1, wherein said light emitting active layer has a multi-quantum well structure, a semiconductor superlattice periodic thin film layer is provided on a side of a quantum well layer first provided on said multi-quantum well structure active layer, and a waveguide structure is constituted on a side of said semiconductor misoriented substrate.

7. A semiconductor light emitting device according to claim 4, wherein said light emitting active layer has a multi-quantum well structure, a semiconductor superlattice periodic thin film layer is provided on a side of a quantum well layer first provided on said multi-quantum well structure active layer, and a waveguide structure is constituted on a side of said semiconductor misoriented substrate.

8. A semiconductor light emitting device according to claim 6, comprising a waveguide structure in which energy between quantum levels formed in said semiconductor superlattice periodic thin film layer is larger than that within the active layer of said multi-quantum well structure.

9. A semiconductor light emitting device according to claim 7, comprising a waveguide structure in which energy between quantum levels formed in said semiconductor superlattice periodic thin film layer is larger than that within the active layer of said multi-quantum well structure.

10. A semiconductor light emitting device according to claim 6, wherein said multi-quantum well structure has at least a strained multi-quantum well structure having a lattice strain introduced into the quantum well layer.

11. A semiconductor light emitting device according to claim 7, wherein said multi-quantum well structure has at least a strained multi-quantum well structure having a lattice strain introduced into the quantum well layer.

12. A semiconductor light emitting device according to claim 6, comprising a waveguide structure in which said multi-quantum well structure has at least a strained multi-quantum well structure having a lattice strain introduced into the quantum well layer, and a quantum barrier layer has a strained compensation multi-quantum well structure having a lattice strain having a symbol opposite to the quantum well layer introduced.

13. A semiconductor light emitting device according to claim 7, comprising a waveguide structure in which said multi-quantum well structure has at least a strained multi-quantum well structure having a lattice strain introduced into the quantum well layer, and a quantum barrier layer has a strained compensation multi-quantum well structure having a lattice strain having a symbol opposite to the quantum well layer introduced.

14. A semiconductor light emitting device according to claim 1, wherein a combination of a superlattice well layer and a superlattice barrier layer of said semiconductor superlattice periodic thin film layer is one selected from a group consisting of GaAs/AlGaAs, GaAsP/AlGaInAs, GaInAs/AlGaInAs, GaInAs/AlInAs, GaInAs/AlGaAsP, GaInP/AlGaInP, AlGaInP/AlGaInP, GaInAsP/AlGaInP, GaInAsp/GaInP, GaInAsP/GaInAsP, GaInAsP/InP, and GaInAs/InP.

15. A semiconductor light emitting device according to claim 6, wherein a combination of a superlattice well layer and a superlattice barrier layer of said semiconductor superlattice periodic thin film layer is one selected from a group consisting of GaAs/AlGaAs, GaAsP/AlGaInAs, GaInAs/AlGaInAs, GaInAs/AlInAs, GaInAs/AlGaAsP, GaInP/AlGaInP, AlGaInP/AlGaInP, GaInAsP/AlGaInP, GaInAsP/GaInP, GaInAsP/GaInAsP, GaInAsP/InP, and GaInAs/InP.

16. A semiconductor light emitting device according to claim 7, wherein a combination of a superlattice well layer and a superlattice barrier layer of said semiconductor superlattice periodic thin film layer is one selected from a group consisting of GaAs/AlGaAs, GaAsP/AlGaInAs, GaInAs/AlGaInAs, GaInAs/AlInAs, GaInAs/AlGaAsP, GaInP/AlGaInP, AlGaInP/AlGaInP, GaInAsP/AlGaInP, GaInAsP/GaInP, GaInAsP/GaInAsP, GaInAsP/InP, and GaInAs/InP.

17. A semiconductor light emitting device according to claim 14, wherein at least either one of the superlattice well layer or the superlattice barrier layer of said semiconductor superlattice periodic thin film layer contains an As element.

18. A semiconductor light emitting device according to claim 15, wherein at least either one of the superlattice well layer or the superlattice barrier layer of said semiconductor superlattice periodic thin film layer contains an As element.

19. A semiconductor light emitting device according to claim 1, comprising a waveguide structure which is formed in a stripe area composed of a light emitting active layer and an optical waveguide layer provided on a single crystal substrate, in which impurities are diffused and introduced into a light emitting active layer area at a lower part of the strip in the vicinity of an end of a resonator whereby the forbidden band width of said light emitting active layer area is larger than that of an area in which impurities are not diffused, which is formed with a window structure for a laser beam which is at least larger than energy of a laser beam generated in the resonator in which impurities are not diffused, and which outgoes outside from an impurity diffusion window structure area provided in the vicinity of the end of the resonator.

20. A semiconductor light emitting device according to claim 19, comprising a waveguide structure provided with a window structure area in which the forbidden band width in the light emitting active layer area at the lower part of the stripe in the vicinity of the end of the resonator into which impurities are introduced of said waveguide structure is larger at least not less than 50 meV than energy of a laser beam generated.

21. A semiconductor light emitting device according to claim 19, comprising a waveguide structure in which with respect to the window structure area constituting the light emitting active layer area at the lower part of the stripe in the vicinity of the end of said resonator, a non-injection area of current is provided at the upper part or lower part thereof, and the current non-injection area is longer than the window structure area.

22. A semiconductor light emitting device according to claim 20, comprising a waveguide structure in which with respect to the window structure area constituting the light emitting active layer area at the lower part of the stripe in the vicinity of the end of said resonator, a non-injection area of current is provided at the upper part or lower part thereof, and the current non-injection area is longer than the window structure area.

23. A semiconductor light emitting device comprising:
a semiconductor misoriented substrate;
a cladding layer provided on said semiconductor misoriented substrate;
a semiconductor superlattice thin film layer having a thickness in an atomic layer order provided on said cladding layer, said semiconductor superlattice thin film layer having a flatness in an atomic layer order at least on the opposite side of said cladding layer; and
a semiconductor multi-layer having at least a light emitting layer provided on said semiconductor superlattice thin film layer, said light emitting layer having a flatness in an atomic layer order.

* * * * *